(12) United States Patent
Horikiri et al.

(10) Patent No.: US 10,181,407 B2
(45) Date of Patent: *Jan. 15, 2019

(54) METHOD FOR MANUFACTURING NIOBATE-SYSTEM FERROELECTRIC THIN-FILM DEVICE

(71) Applicant: SUMITOMO CHEMICAL COMPANY, LIMITED, Tokyo (JP)

(72) Inventors: Fumimasa Horikiri, Hitachi (JP); Kenji Shibata, Hitachi (JP); Kazutoshi Watanabe, Hitachi (JP); Kazufumi Suenaga, Tokyo (JP); Masaki Noguchi, Tokyo (JP); Kenji Kuroiwa, Tokyo (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/560,679

(22) PCT Filed: Mar. 17, 2016

(86) PCT No.: PCT/JP2016/058523
§ 371 (c)(1),
(2) Date: Sep. 22, 2017

(87) PCT Pub. No.: WO2016/152724
PCT Pub. Date: Sep. 29, 2016

(65) Prior Publication Data
US 2018/0108530 A1 Apr. 19, 2018

(30) Foreign Application Priority Data

Mar. 24, 2015 (JP) ................................ 2015-061190

(51) Int. Cl.
*H01L 21/308* (2006.01)
*H01L 41/187* (2006.01)
(Continued)

(52) U.S. Cl.
CPC .......... *H01L 21/308* (2013.01); *H01L 41/187* (2013.01); *H01L 41/1873* (2013.01); *H01L 41/316* (2013.01); *H01L 41/332* (2013.01)

(58) Field of Classification Search
None
See application file for complete search history.

(56) References Cited

U.S. PATENT DOCUMENTS

| 9,685,603 | B2 * | 6/2017 | Horikiri | .............. H01L 41/1873 |
| 2003/0092203 | A1 * | 5/2003 | Murai | .................. B41J 2/14233 438/3 |

(Continued)

FOREIGN PATENT DOCUMENTS

| EP | 2843723 | A1 | | 3/2015 |
| JP | 2000031133 | A | * | 1/2000 |

(Continued)

OTHER PUBLICATIONS

English translation of Horikiri et al. (JP-2012-244090), Manufacture of piezoelectric film element used for e.g. head of scanner, involves forming lower electrode on substrate, forming piezoelectric film of alkali-niobium oxide-type perovskite structure and wet-etching piezoelectric film), Dec. 10, 2012.*

(Continued)

*Primary Examiner* — Khaja Ahmad
(74) *Attorney, Agent, or Firm* — Birch, Stewart, Kolasch & Birch, LLP

(57) ABSTRACT

This method for manufacturing a niobate-system ferroelectric thin-film device includes: a lower electrode film formation step of forming a lower electrode film on a substrate; a ferroelectric thin film formation step of forming a niobate-system ferroelectric thin film on the lower electrode film; an etch mask pattern formation step of forming an etch mask in a desired pattern on the niobate-system ferroelectric thin film, the etch mask being an amorphous fluororesin film (Continued)

laminated via a noble metal film; and a ferroelectric thin film etching step of shaping the niobate-system ferroelectric thin film into a desired fine pattern by wet etching using an etchant comprising: a chelating agent; an aqueous alkaline solution containing an aqueous ammonia solution; and an aqueous hydrogen peroxide solution.

11 Claims, 4 Drawing Sheets

(51) Int. Cl.
*H01L 41/316* (2013.01)
*H01L 41/332* (2013.01)

(56) References Cited

U.S. PATENT DOCUMENTS

| | | | |
|---|---|---|---|
| 2007/0210483 A1* | 9/2007 | Lee | B29C 33/3857 264/220 |
| 2008/0284543 A1 | 11/2008 | Taniguchi et al. | |
| 2010/0073815 A1* | 3/2010 | Aoki | G11B 5/3106 360/110 |
| 2010/0320871 A1 | 12/2010 | Suenaga et al. | |
| 2012/0025667 A1* | 2/2012 | Horikiri | H01L 41/0805 310/314 |
| 2012/0056508 A1 | 3/2012 | Horikiri et al. | |
| 2012/0236081 A1 | 9/2012 | Nakayama et al. | |
| 2014/0076842 A1* | 3/2014 | Takahashi | H01L 41/29 216/13 |
| 2014/0339962 A1 | 11/2014 | Furukawa et al. | |
| 2016/0027996 A1 | 1/2016 | Fujii et al. | |

FOREIGN PATENT DOCUMENTS

| | | |
|---|---|---|
| JP | 2007-19302 A | 1/2007 |
| JP | 2012-33693 A | 2/2012 |
| JP | 2012-244090 A | 12/2012 |
| JP | 2012244090 A * | 12/2012 |
| JP | 2013-16776 A | 1/2013 |
| JP | 2013-102089 A | 5/2013 |
| JP | 2014-60267 A | 4/2014 |
| JP | 2014-203839 A | 10/2014 |
| JP | 2015-24663 A | 2/2015 |
| JP | 2015-53417 A | 3/2015 |

OTHER PUBLICATIONS

English translation of Emmanuel et al. (JP 2000-031133, Etching of perovskite type oxide used in dynamic random access memory circuit, ferro-electric non-volatilized memory process involves contacting surface with etchant solution having hydrogen peroxide), Aug. 12, 2000.*

Horikiri et al., "The Wet Etching Technique of KNN films by EDTA", JSAP Spring Meeting Koen Yokoshu, Mar. 3, 2014, pp. 6-010.

International Search Report, issued in PCT/JP2016/058523 (PCT/ISA/210), dated May 31, 2016.

Extended European Search Report for European Application No. 16746410.6, dated Aug. 30, 2018.

Extended European Search Report for European Application No, 16768322.6, dated Aug. 24, 2018.

Extended European Search Report for European Application No. 16768324.2, dated Aug. 24, 2018.

Extended European Search Report for European Application No. 16768326.7, dated Oct. 1, 2018.

Extended European Search Report for European Application No. 16768627.8, dated Aug. 27, 2018.

Extended European Search Report for European Application No. 16772062.2, dated Oct. 1, 2018.

* cited by examiner

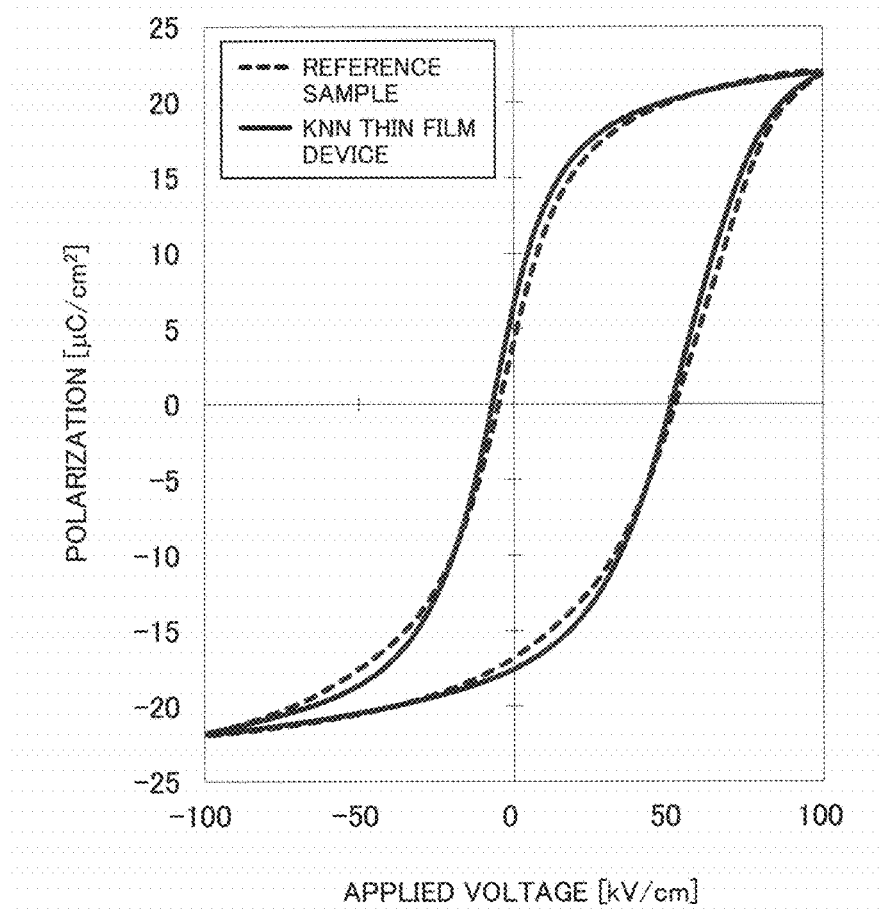

METHOD FOR MANUFACTURING NIOBATE-SYSTEM FERROELECTRIC THIN-FILM DEVICE

TECHNICAL FIELD OF THE INVENTION

The present invention relates to technologies regarding ferroelectric thin film devices and particularly to methods for manufacturing lead-free niobate-system ferroelectric thin film devices.

DESCRIPTION OF BACKGROUND ART

Ferroelectrics are very attractive substances because of their peculiar characteristics (such as very high relative permittivity, and good pyroelectric, piezoelectric and ferroelectric properties). So, various devices (such as ceramic multilayer capacitors, pyroelectric devices, piezoelectric devices and ferroelectric memories) have been developed and put into use utilizing such peculiar properties. Typical ferroelectrics are perovskite materials such as barium titanate ($BaTiO_3$) and lead zirconate titanate ($Pb(Zr_{1-x}Ti_x)O_3$, PZT). Of these, lead zirconate titanates (PZTs) provide relatively excellent polarization and piezoelectric properties and are therefore most widely used.

Lead-containing PZTs are specified hazardous substances. However, because there are currently no suitable commercially available alternative pyroelectric or piezoelectric materials, PZTs are exempt from the RoHS directive (the directive on the restriction of the use of specified hazardous substances in electrical and electronic equipment enforced by the European Union and Council of Europe). However, with the growing worldwide responsibility towards global environment conservation, a strong demand exists for development of pyroelectric and piezoelectric devices using lead-free ferroelectric materials.

Also, with the recent trend toward smaller and lighter electronic devices, there is an increasing need for ferroelectric thin film devices in which a thin-film technology is utilized.

Herein, pyroelectric and piezoelectric thin film devices will be described below as representatives of such ferroelectric thin film devices. Piezoelectric devices utilize the piezoelectric effect of a ferroelectric material, and are widely used as functional devices such as actuators and stress sensors. Actuators generate a displacement or vibration in response to an applied voltage to a ferroelectric (piezoelectric) material. Stress sensors generate a voltage in response to a strain produced in a piezoelectric material. Pyroelectric devices detect light (including infrared light) utilizing the pyroelectric effect of a ferroelectric material, and are widely used as infrared human body sensors, etc.

Examples of piezoelectric devices utilizing a lead-free piezoelectric material are described below. Patent Literature 1 discloses a piezoelectric thin film device including, on a substrate, a lower electrode, a piezoelectric thin film and an upper electrode. The piezoelectric thin film is made of an alkali niobate-based perovskite dielectric material of a chemical formula ($Na_xK_yLi_z$)$NbO_3$ (where $0<x<1$, $0<y<1$, $0<z<1$, and $x+y+z=1$). A buffer layer of a perovskite crystal structure material is formed between the piezoelectric thin film and the lower electrode. The perovskite buffer layer is highly preferentially (001), (100), (010) or (111) oriented. According to this Patent Literature 1, the piezoelectric thin film device utilizing the lead-free lithium potassium sodium niobate thin film exhibits sufficient piezoelectric properties.

Piezoelectric devices have a basic structure of a piezoelectric material sandwiched between two electrodes and are micro-fabricated into a beam shape or a tuning fork shape depending on their application. So, micro fabrication processes are important in order to put piezoelectric devices using lead-free piezoelectric materials to practical use.

Patent Literature 2 discloses a method of processing a wafer having thereon a piezoelectric thin film of a chemical formula ($K_{1-x}Na_x$)$NbO_3$ (where $0.4 \leq x \leq 0.7$). The method includes the first step of ion etching the piezoelectric thin film on wafer in an Ar gas atmosphere and the second step of reactive ion etching the resulting wafer in a fluorine based reactive gas/Ar mixture atmosphere. According to this Patent Literature 2, a fine pattern of the piezoelectric thin film can be formed, thereby providing a highly reliable and low cost piezoelectric thin film device.

Patent Literature 3 discloses a method for manufacturing a piezoelectric film device, which includes the steps of: forming a lower electrode on a substrate; forming, on the lower electrode, a piezoelectric film of an alkali niobate-based perovskite material represented by a chemical formula ($K_{1-x}Na_x$)$NbO_3$; and wet-etching the piezoelectric film using a hydrogen fluoride-based etchant and a Cr film etch mask. According to this Patent Literature 3, the Cr mask and the lower electrode are not etched by the hydrogen fluoride-based etchant; therefore, the piezoelectric film alone can be selectively etched. Thus, a fine pattern of the piezoelectric film can be accurately formed in a short time.

CITATION LIST

Patent Literature

Patent Literature 1: JP 2007-019302 A
Patent Literature 2: JP 2012-033693 A
Patent Literature 3: JP 2012-244090 A

SUMMARY OF THE INVENTION

Problems to be Solved by the Invention

As described above, niobate-based ferroelectric materials (such as potassium sodium niobate (($K_{1-x}Na_x$)$NbO_3$) are very promising as lead-free ferroelectric materials. In order to put thin film devices using niobate-based ferroelectric materials as alternatives for PZTs to practical use and mass production, it is very important to develop and establish techniques for micro-fabricating niobate-based ferroelectric thin film devices with a high dimensional accuracy and at low cost.

However, niobate-based ferroelectric materials are relatively new materials, and their micro fabrication techniques are still under development. In these respects, the above-disclosed manufacturing techniques have the following disadvantages: The dry etching technique of the above Patent Literature 2 would achieve a high dimensional accuracy. However, this dry etching technique requires an expensive etching apparatus because it is a vacuum process. In addition, the technique has only a relatively low throughput.

The wet etching technique of the above Patent Literature 3 would achieve a relatively high throughput and therefore have an advantage over dry etching processes in terms of manufacturing cost. However, niobate-based ferroelectric materials are chemically stable and are therefore difficult to fine-etch using an etchant other than hydrogen fluoride-based etchants. Hydrogen fluoride-based etchants require very careful handling for safety reasons and the usable etch masks are limited. These disadvantages increase the manufacturing cost and therefore might impair or offset the above-mentioned manufacturing cost advantage.

In view of the foregoing, it is an objective of the present invention to solve the above problems and provide a method for micro-fabricating a ferroelectric thin film device utilizing a lead-free niobate-system ferroelectric material with a high dimensional accuracy and at lower than conventional cost.

Solution to Problems

According to one aspect of the present invention, a method for manufacturing a niobate-system ferroelectric thin film device includes a lower electrode film formation step, a ferroelectric thin film formation step, an etch mask pattern formation step, and a ferroelectric thin film etching step. In the lower electrode film formation step, a lower electrode film is formed on a substrate. In the ferroelectric thin film formation step, a niobate-system ferroelectric thin film is formed on the lower electrode film. In the etch mask pattern formation step, an etch mask is formed in a desired pattern on the niobate-system ferroelectric thin film. In the ferroelectric thin film etching step, the niobate-system ferroelectric thin film is shaped into a desired fine pattern by wet etching using an etchant containing a chelating agent, an aqueous alkaline solution, and an aqueous hydrogen peroxide solution (referred to $H_2O_2$ aq.). The aqueous alkaline solution contains an aqueous ammonia solution (referred to $NH_3$ aq.). The etch mask is an amorphous fluororesin film laminated via a noble metal film.

In the above aspect of the invention, the following modifications and changes can be made.

(i) The method may further include an upper electrode formation step of forming an upper electrode on the niobate-system ferroelectric thin film and a dicing step of cutting one or more chip-shaped niobate-system ferroelectric thin film devices out from the substrate, having thereon the niobate-system ferroelectric thin film, having thereon the upper electrode. The upper electrode may be the noble metal film.

(ii) The chelating agent may be at least one selected from ethylene diamine tetraacetic acid (referred to EDTA), ethylene diamine tetra(methylene phosphonic acid) (referred to EDTMP), nitrilotris(methylene phosphonic acid) (referred to NTMP), cyclohexane diamine tetraacetic acid (referred to CyDTA), 1-hydroxyethane-1,1-diphosphonic acid(etidronic acid) (referred to HEDP), glycine-N,N-bis(methylene phosphonic acid) (referred to GBMP), diethylene triamine penta (methylene phosphonic acid) or (referred to DTPMP), citric acid, and their salts.

(iii) When the chelating agent is EDTA, EDTMP, NTMP, CyDTA, HEDP, GBMP, DTPMP or their salts, the chelating agent in the etchant may have a molarity of 0.001 M (mol/L) or more and 0.5 M (mol/L) or less. When the chelating agent is citric acid or citrates, the chelating agent in the etchant may have a molarity of 0.03 M or more and 1 M or less.

(iv) The salts for the chelating agent may be at least one selected from sodium salt, potassium salt, lithium salt, and ammonium salt.

(v) The noble metal film may be a platinum (Pt) film via a titanium (Ti) layer or a gold (Au) film via one of a nickel (Ni) layer, a cobalt (Co) layer, a tungsten (W) layer and a molybdenum (Mo) layer.

(vi) At the ferroelectric thin film etching step, the etchant may have a temperature of 60° C. or higher and lower than 100° C.

(vii) The niobate-system ferroelectric thin film may be made of potassium sodium niobate $((K_{1-x}Na_x)NbO_3$, referred to KNN) or lithium niobate ($LiNbO_3$, referred to LN).

(viii) The lower electrode film may be a Pt film via a Ti layer.

(ix) The niobate-system ferroelectric thin film may have a pseudo cubic system or a tetragonal system, and be formed by sputtering such that the film has a main surface with a (001) crystal plane preferential orientation.

(x) The substrate may be a silicon (Si) substrate having a thermally oxidized film on its surface.

Advantages of the Invention

According to the present invention, it is possible to wet etch a lead-free niobate-system ferroelectric thin film into a desired fine pattern with a high dimensional accuracy and at a lower cost than before. As a result, it is possible to provide a niobate-system ferroelectric thin film device in which a desired fine pattern of the ferroelectric thin film is formed at low manufacturing cost.

BRIEF DESCRIPTION OF THE DRAWINGS

FIG. 6 is a graph showing exemplary relationships between polarization value and applied voltage of a KNN thin film device fabricated according to the invention and a reference sample.

DETAILED DESCRIPTION OF THE PREFERRED EMBODIMENTS

The present inventors focused on niobate-system (niobate-based) ferroelectric materials [specifically, potassium sodium niobate (($K_{1-x}Na_x)NbO_3$, KNN) and lithium niobate ($LiNbO_3$, LN)] as lead-free ferroelectric materials that were expected to have pyroelectric or piezoelectric properties comparable to those of lead zirconate titanates ($Pb(Zr_{1-x}Ti_x)O_3$, PZT), and intensively investigated wet etching techniques usable for the niobate-system ferroelectric materials focused. After various investigations, the following results were obtained. The niobate-system ferroelectric materials are conventionally thought to be difficult to fine-etch using an etchant other than hydrogen fluoride-based etchants. However, the niobate-system ferroelectric materials can be wet-etched using novel etchants containing a predetermined chelating agent, an aqueous alkaline solution and an aqueous hydrogen peroxide solution with high dimensional accuracy. In addition, resin films can be used as an etch mask because the new etchants do not contain hydrogen fluoride.

Chelating agents are thought to be less harmful to the human body and environment. So, simpler and less inexpensive etching apparatuses can be used, thus considerably reducing manufacturing and equipment cost. Further, because cheap and commonly used resin films can be used as an etch mask, the etching process (especially, an etch mask formation process) by using this new etchant can be simplified, thus considerably reducing manufacturing process cost. The present invention is based on these new findings.

Preferred embodiments of the present invention will be described below with reference to the accompanying drawings. Hereinafter, the invention will be described using mainly KNN as the niobate-system ferroelectric material. However, the invention is not limited to the specific embodiments described below, but various combinations and modifications are possible without departing from the spirit and scope of the invention.

Figure 1:
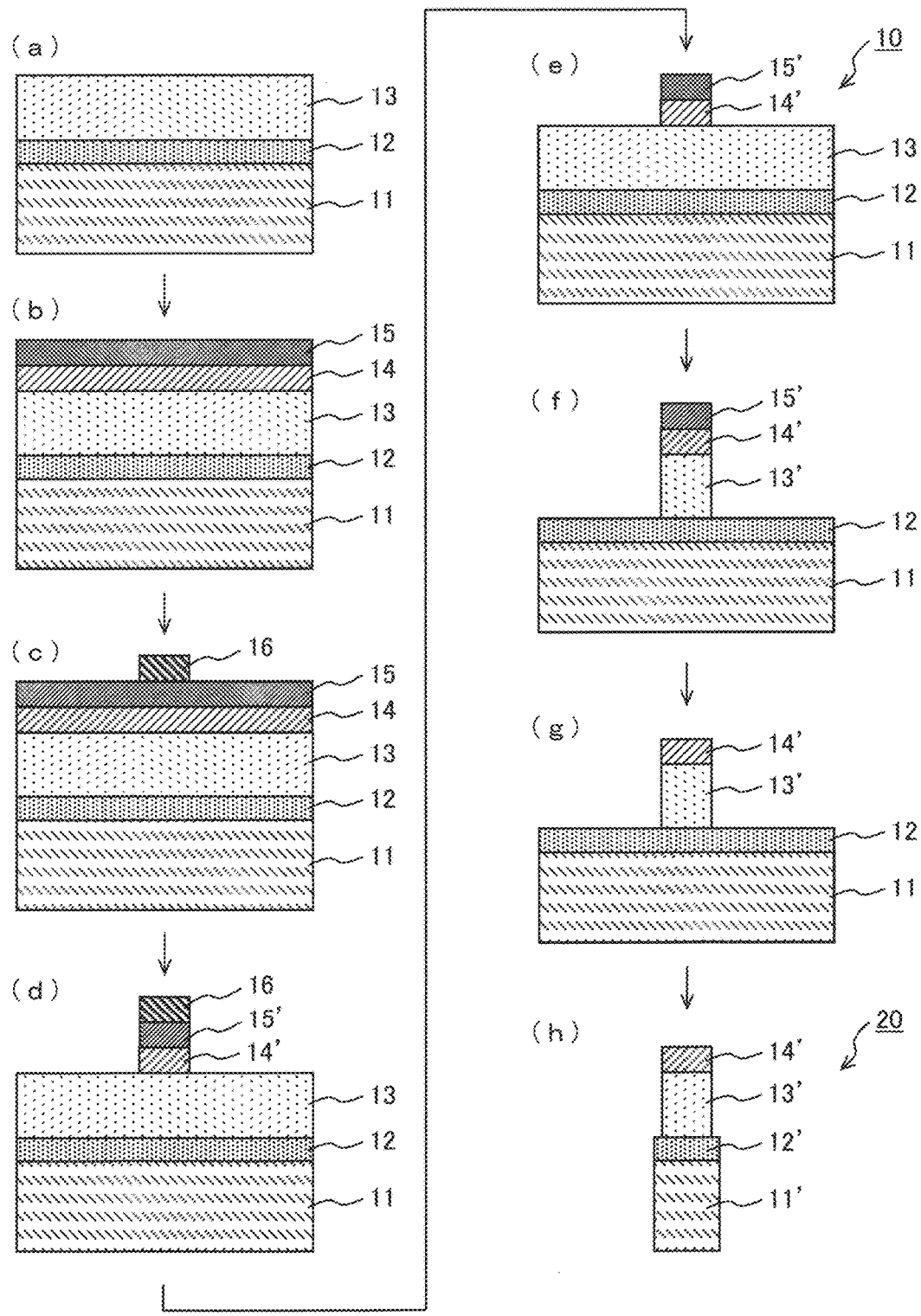
FIG. 1 is a schematic illustration showing an enlarged cross sectional view of manufacturing steps of a niobate-system ferroelectric thin film device according to the present invention.

FIG. 1 is a schematic illustration showing an enlarged cross sectional view of manufacturing steps of a niobate-system ferroelectric thin film device according to the invention. While a cleaning step and a drying step are not described below, it is preferable that these steps are performed as needed.

First, a substrate 11 is prepared. A material of the substrate 11 is not particularly limited, and may be properly selected based on applications of the pyroelectric or piezoelectric device. For example, silicon (Si), SOI (Silicon on Insulator), quartz glass, gallium arsenide (GaAs), gallium nitride (GaN), sapphire ($Al_2O_3$), magnesium oxide (MgO), zinc oxide (ZnO), and strontium titanate ($SrTiO_3$) may be used. From the view point of cost, using Si substrates is preferable among these materials. When an electrically conductive material is used as the substrate 11, its surface is preferably covered with an electrical insulating film (e.g. an oxide film). There is no particular limitation on a method of forming the oxide film. For example, thermal oxidation and chemical vapor deposition (CVD) are suitable.

(Lower Electrode Film Formation Step)

At this lower electrode film formation step, a lower electrode film 12 is formed on the substrate 11 (see FIG. 1(a)). There is no particular limitation on a material of the lower electrode film 12; however, platinum (Pt) and an alloy mainly containing platinum are preferable. Because Pt is inert to an etchant used in a later-described ferroelectric film etching step, Pt can be used as an etch stop. There is no particular limitation on a method for forming the lower electrode film 12 and a thickness thereof. For example, the lower electrode film 12 with a thickness of approximately 100 to 300 nm is formed preferably by sputtering.

The lower electrode film 12 is preferably formed via an adhesive layer (e.g. a titanium (Ti) layer with a thickness of 1 to 5 nm) to enhance the adhesion between the substrate 11 and the lower electrode film 12. Also, the lower electrode film 12 preferably has an arithmetic mean surface roughness (Ra) of 0.86 nm or less so that a later-formed niobate-system ferroelectric thin film 13 can exhibit sufficient pyroelectric and piezoelectric properties.

(Ferroelectric Thin Film Formation Step)

At this ferroelectric thin film formation step, the niobate-system ferroelectric thin film 13 is formed on the lower electrode film 12 (see FIG. 1(a)). KNN (($K_{1-x}Na_x$)$NbO_3$, 0.4≤x≤0.7) is preferable as a material of the niobate-system ferroelectric thin film 13. Preferably, in order to achieve sufficient ferroelectric performance, a crystal system of the niobate-system ferroelectric thin film 13 is a pseudo cubic or tetragonal system and a (001) crystal plane is preferentially oriented parallel to a thin film surface.

There is no particular limitation on the method for forming the niobate-system ferroelectric thin film 13 as long as a desired KNN thin film is obtained. Preferable methods include sputtering using a sintered body target having a desired composition, electron beam evaporation, and pulsed laser deposition because these methods allow orientation control of the KNN crystal as well as being excellent in terms of film formation reproducibility, film formation rate, and running costs.

The KNN thin film 13 may contain one or more selected from lithium (Li), tantalum (Ta), antimony (Sb), calcium (Ca), copper (Cu), barium (Ba) and Ti in a total amount of 5 atomic percent or less.

LN ($LiNbO_3$) is also preferable as a material of the niobate-system ferroelectric thin film 13 for the same reason as described above for KNN.

(Upper Electrode Formation Step)

In this step, an upper electrode film 14 is formed on the niobate-system ferroelectric thin film 13 (see FIG. 1(b)). Preferable materials for the upper electrode film 14 include noble metals such as Pt, palladium (Pd), rhodium (Rh), iridium (Ir), and gold (Au). There is no particular limitation on a method for forming the upper electrode film 14 and a thickness thereof. For example, the upper electrode film 14 with a thickness of approximately 100 to 300 nm is formed preferably by sputtering.

The upper electrode film 14 is preferably formed via an adhesive layer (e.g. a Ti layer with a thickness of 2 to 5 nm, or a nickel (Ni) layer, a cobalt (Co) layer, a tungsten (W) layer and a molybdenum (Mo) layer, each having a thickness of 5 to 50 nm) to enhance the adhesion between the niobate-system ferroelectric thin film 13 and the upper electrode 14.

(Etch Mask Formation Step)

In this step, an etch mask against the wet etching described below is formed on the upper electrode film 14. First, an amorphous fluororesin film to serve as an etch mask film 15 is formed on the upper electrode film 14 (see FIG. 1(b)). Next, a photoresist pattern 16 to pattern the etch mask film 15 is formed on the etch mask film 15 by a photolithographic process (see FIG. 1(c)). Subsequently, the etch mask film 15 is etched according to the photoresist pattern 16 to form an etch mask pattern 15' having a desired pattern (see FIG. 1(d)).

(Upper Electrode Film Etching Step)

In this step, the upper electrode film 14 is etched into a pattern defined by the etch mask pattern 15' and the photoresist pattern 16 to form an upper electrode 14' (see FIG. 1(d)). There is no particular limitation on the etching method of the upper electrode film 14, and it may be a dry-etching process or a wet-etching process.

Next, the photoresist pattern 16 is removed while the etch mask pattern 15' and the upper electrode 14' are left to remain (see FIG. 1(e)). As a result, a ferroelectric thin film laminated substrate 10 having a desired etch mask pattern is obtained.

(Ferroelectric Thin Film Etching Step)

At this ferroelectric thin film etching step, the niobate-system ferroelectric thin film 13 is wet etched to form a fine pattern defined by the etch mask pattern 15' (see FIG. 1(f)). The etchant used at this step preferably contains a chelating agent, an aqueous alkaline solution and an aqueous hydrogen peroxide solution and does not contain hydrogen fluoride (i.e., not containing fluorine ions). The use of such a hydrogen fluoride-free etchant reduces the safety cost conventionally needed to use hydrogen fluoride-based etchants.

The etchant will be specifically described hereinafter. For the chelating agent, at least one selected from EDTA (ethylene diamine tetraacetic acid), EDTMP (ethylenediamine tetra(methylene phosphonic acid)), NTMP (nitrilotris(methylene phosphonic acid)), CyDTA (cyclohexane diamine tetraacetic acid), HEDP (1-hydroxyethane-1,1-diphosphonic acid(etidronic acid)), GBMP (glycine-N,N-bis(methylene phosphonic acid)), DTPMP (diethylenetriamine penta(methylene phosphonic acid)), citric acid, and their salts (sodium salt, potassium salt, lithium salt and ammonium salt) may be preferably used.

Examples of the salts for the chelating agent include ethylene diamine tetraacetic acid disodium salt (referred to EDTA.2Na), ethylene diamine tetraacetic acid trisodium salt (referred to EDTA.3Na), ethylene diamine tetraacetic acid tetrasodium salt (referred to EDTA.4Na), ethylene diamine tetraacetic acid dipotassium salt (referred to EDTA.2K), ethylene diamine tetraacetic acid tripotassium salt (referred to EDTA.3K), ethtylene diamine tetraacetic acid dilithium salt (referred to EDTA.2Li), ethylene diamine tetraacetic acid diammonium salt (referred to EDTA.2NH$_4$), ethylene diamine tetra(methylene phosphonic acid) pentasodium salt (referred to EDTMP.5Na), nitrilotris(methylene phosphonic acid) pentasodium salt (referred to NTMP.5Na), 1-hydroxyethane-1,1-diphosphonic acid(etidronic acid) trisodium salt (referred to HEDP.3Na), 1-hydroxyethane-1,1-diphosphonic acid(etidronic acid) tetrasodium salt (referred to HEDP.4Na), diethylene triamine penta(methylene phosphonic acid) heptasodium salt (referred to DTPMP.7Na), sodium dihydrogen citrate salt, disodium hydrogen citrate salt, trisodium citrate salt, potassium dihydrogen citrate salt, dipotassium hydrogen citrate salt, tripotassium citrate salt, trilithium citrate salt, ammonium dihydrogen citrate salt, diammonium hydrogen citrate salt, and triammonium citrate salt.

When the chelating agent is EDTA, EDTMP, CyDTA, NTMP, HEDP, GBMP, DTPMP, or a salt thereof, the molarity of the chelating agent in the etchant is preferably 0.001 M (mol/L) or more and 0.5 M (mol/L) or less, more preferably 0.003 M or more and 0.3 M or less, and even more preferably 0.01 M or more and 0.2 M or less. When the molarity of the chelating agent is less than 0.001 M, the etching reaction activity is insufficient. When it exceeds 0.5 M, the etching reaction activity decreases.

Also, when the chelating agent is citric acid or a salt thereof, the molarity of the chelating agent in the etchant is preferably 0.03 M (mol/L) or more and 1 M (mol/L) or less, more preferably 0.05 M or more and 0.7 M or less, and even more preferably 0.1 M or more and 0.6 M or less. When the molarity of the chelating agent is less than 0.03 M, the etching reaction activity is insufficient. When it exceeds 1 M, the etching reaction activity decreases.

For the solvent for the chelating agent, an aqueous alkaline solution and an $H_2O_2$ aq. are preferably used. For the aqueous alkaline solution, an $NH_3$ aq., an aqueous sodium hydroxide solution (referred to NaOH aq.) and an aqueous potassium hydroxide solution (referred to KOH aq.) may be used. However, it preferably contains mainly $NH_3$ aq.

The etchant is prepared so as to have a hydrogen ion exponent (potential of hydrogen: pH) of preferably 7.5 or more and 12 or less, more preferably 8 or more and 10 or less. When the pH is less than 7.5, the etching reaction activity is insufficient. When it exceeds 10, the etching reaction activity begins to decrease. When it exceeds 12, the etching reaction activity further decreases and becomes saturated.

When an $NH_3$ aq. is used for the aqueous alkaline solution, the $NH_3$ concentration is preferably 3 M (mol/L) or more and 10 M (mol/L) or less, for example. The pH may be adjusted by adding a strong acid (e.g. hydrochloric acid) or a strong base (e.g. sodium hydroxide and potassium hydroxide).

The concentration of the $H_2O_2$ aq. is preferably 4 M (mol/L) or more and 9 M (mol/L) or less, more preferably 5 M or more and 8 M or less. When the $H_2O_2$ concentration is less than 4 M, the etching reaction activity is insufficient. When it exceeds 9 M, preparation of the etchant is difficult.

As the individual chemicals that constitute the etchant, commercially available reagents may be used. Also, the etchant to be used is preferably prepared immediately before the wet-etching process.

When the etchant is prepared, particularly when it is prepared in a relatively large amount (e.g. 2 L or more), it is prepared preferably by a two-liquid mixing system in which a separately prepared concentrated solution containing the chelating agent and an $NH_3$ aq. (chelating agent/ammonia concentrated solution) is diluted and mixed with an $H_2O_2$ aq. The chelating agent/ammonia concentrated solution is excellent in preservability and therefore can be prepared in advance.

Preparation of the etchant by the two-liquid mixing system makes it possible to prepare a required amount of etchant immediately before the wet-etching process in an extremely short time, thereby significantly reducing the time that is required to complete the entire etching process (resulting in a further reduced process cost).

The amorphous fluororesin etch mask pattern 15' and the lower electrode film 12 (Pt or Pt alloy) are inert (resistant) to the above-described etchants; thus, the patterned niobate-system ferroelectric thin film 13' (which is a desired fine pattern of the niobate-system ferroelectric thin film 13) can be formed (see FIG. 1(*f*)). The etching reaction activity can be enhanced by raising the etching temperature (etchant temperature) from a room temperature to a higher temperature. The etchant temperature is preferably 50° C. or higher, more preferably 60° C. or higher and even more preferably 80° C. or higher. However, in view of operational safety, the etchant temperature is preferably lower than 100° C.

The etching reaction mechanism of the invention is not fully clarified. But, the chelating agent and the hydrogen peroxide by coexisting with each other would react with niobium to form a chemically very stable chelate peroxide (e.g. Nb—$H_2O_2$-EDTA, Nb—$H_2O_2$-EDTMP), which is probably effective in etching the niobate-system ferroelectric thin film 13.

After the wet-etching process described above, the etch mask pattern 15' is removed (see FIG. 1(*g*)). There is no particular limitation on the method for removing the etch mask pattern 15', and a dry-etching process, for example, may preferably be used.

(Dicing Step)

Figure 2:
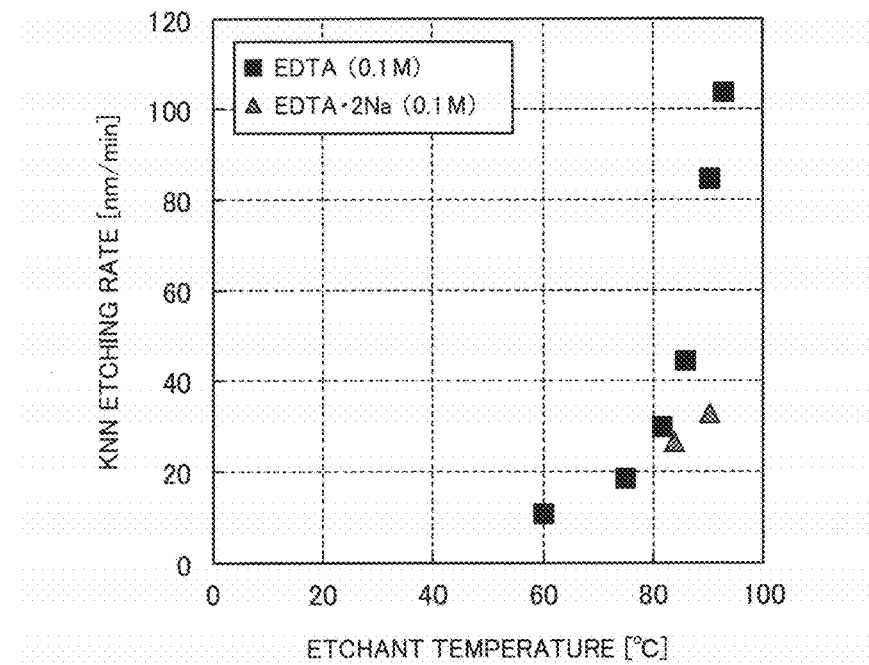
FIG. 2 is a graph showing exemplary relationships between etching rate and etchant temperature in a KNN thin film laminated substrate of Example 1.

At this dicing step, the substrate with the patterned niobate-system ferroelectric thin film 13' and the upper electrode 22', each having a desired pattern, is diced into a chip of a niobate-system ferroelectric thin film device 20 (see FIG. 2(*f*)). Meanwhile, the reference numeral 11' designates the diced substrate of the chip 20 and numeral 12' designates the lower electrode in the chip 20. Thus, the formation of the niobate-system ferroelectric thin film device chip 20 having thereon a desired fine pattern of the niobate-system ferroelectric thin film is completed.

EXAMPLES

The present invention will be described more specifically below by way of examples. However, the invention is not limited to the specific examples below.

Examination 1

[Potassium Sodium Niobate Thin Film Device]

(Fabrication of KNN Thin Film-on-Substrate of Example 1)

The KNN thin film-on-substrate 10 was fabricated according to the manufacturing steps illustrated in FIG. 1. A 4-inch (100) Si wafer with thermal oxide film (Si wafer thickness of 0.525 mm; oxide film thickness of 200 nm) was used as the substrate 11.

In the present invention, the thickness of each layer (e.g. the lower electrode adhesive layer, the lower electrode film 12, the niobate-system ferroelectric thin film 13, the upper electrode adhesive layer, and the upper electrode film 14) was controlled by controlling the film formation time based on the film formation rate determined in advance. Also, the thickness measurement for calculation of each film formation rate was conducted by the X-ray reflectivity technique using an X-ray diffractometer (X'Pert PRO MRD, available from PANalytical B.V., Spectris Co., Ltd.).

First, a 2.2-nm thick Ti layer was formed on the Si substrate 11 by RF magnetron sputtering as the lower electrode adhesive layer to enhance adhesion between the substrate 11 and the lower electrode film 12. Next, the lower electrode film 12 was formed by forming a 205-nm thick Pt layer on the Ti adhesive layer by RF magnetron sputtering (see FIG. 1(*a*)). The sputtering conditions for the Ti adhesive layer and Pt lower electrode film 12 were as follows: targets of pure Ti (for the Ti adhesive layer) and pure Pt (for the Pt electrode film); substrate temperature of 250° C.; discharge power of 200 W; sputtering gas of Ar; and gas pressure of 2.5 Pa. The measured arithmetic mean surface roughness of the thus formed lower electrode film 12 was 0.86 nm or less. The sputtering was carried out using a RF sputtering machine (SH-350-T10, available from ULVAC, Inc.) (the same machine was used in all the remaining sputtering processes described below).

After the formation of the Pt lower electrode film 12, the niobate-system ferroelectric thin film 13 was formed by forming a 1.9-µm thick KNN (($K_{0.35}Na_{0.65}$)$NbO_3$) thin film on the lower electrode film 12 by RF magnetron sputtering (see FIG. 1(*a*)). The sputtering condition for the KNN thin film 13 was as follows: target of sintered ($K_{0.35}Na_{0.65}$)$NbO_3$; substrate temperature of 400 to 600° C.; discharge power of 700 to 800 W; sputtering gas of $O_2$/Ar mixture ($O_2$/Ar ratio=0.005); and gas pressure of 0.3 to 1.3 Pa.

Next, a 2-nm thick Ti layer was formed on the KNN thin film 13 by RF magnetron sputtering as the upper electrode adhesive layer to enhance adhesion between the niobate-system ferroelectric thin film 13 and the upper electrode film 14. Subsequently, the upper electrode film 14 was formed by forming a 100-nm thick Pt layer on the Ti adhesive layer by RF magnetron sputtering (see FIG. 1(*b*)). The sputtering conditions for the Ti adhesive layer and Pt upper electrode film 14 were similar to those for the lower electrode film 12 as follows: targets of pure Ti (for the Ti adhesive layer) and pure Pt (for the Pt electrode film); substrate temperature of 250° C.; discharge power of 200 W; sputtering gas of Ar; and gas pressure of 2.5 Pa.

Next, on the upper electrode film 14 formed above, an amorphous fluororesin film having a thickness of 950 nm was formed as an etch mask film 15 by applying, drying and baking an amorphous fluororesin (CTL-809M, available from Asahi Glass Co., Ltd). Then, on the etch mask film 15, a photoresist pattern 16 was formed by applying, exposing and developing a photoresist (OFPR-800, available from TOKYO OHKA KOGYO CO., LTD.) (see FIG. 1(*c*)). Subsequently, the etch mask film 15 was etched according to the photoresist pattern 16 using a dry etcher (EIS-700, available from ELIONIX INC.) to form an etch mask pattern 15' having a desired pattern (see FIG. 1(*d*)). The dry etching condition was as follows: antenna power of 300 W; $O_2$ gas flow of 50 sccm; and gas pressure of 2.7 Pa.

Next, the upper electrode film 14 was etched according to the etch mask pattern 15' and the photoresist pattern 16 using the same dry etcher (EIS-700, available from ELIONIX INC.) under a different etching condition to form an upper electrode 14'. The dry etching condition was as follows: antenna power of 800 W; bias power of 100 W; Ar gas flow of 30 sccm; and gas pressure of 1.8 Pa. Then, the photoresist pattern 16 was removed by acetone cleaning, leaving only the etch mask pattern 15' to remain on the upper electrode 14' to complete the KNN thin film laminated substrate of Example 1 (see FIGS. 1(*d*) and 1(*e*)).

(Fabrication of KNN Thin Film Laminated Substrate of Example 2)

A KNN thin film laminated substrate of Example 2, which was the same as the KNN thin film laminated substrate of Example 1 except for the configuration of the upper electrode film 14 (or the upper electrode 14', which was a patterned upper electrode film 14), was fabricated in the same manner as Example 1 except for the processes associated with the formation of the upper electrode 14'.

A 5-nm thick Ni layer was formed on the KNN thin film 13 by RF magnetron sputtering as the upper electrode adhesive layer to enhance adhesion between the niobate-system ferroelectric thin film 13 and the upper electrode film 14. Subsequently, the upper electrode film 14 was formed by forming a 300-nm thick Au layer on the Ni adhesive layer by RF magnetron sputtering. The sputtering conditions for the Ni adhesive layer and Au upper electrode film 14 were as follows: targets of pure Ni (for the Ni adhesive layer) and pure Au (for the Au electrode film); substrate temperature of 250° C.; discharge power of 200 W; sputtering gas of Ar; and gas pressure of 2.5 Pa.

Next, on the upper electrode film 14, an amorphous fluororesin film having a thickness of 950 nm was formed as the etch mask film 15 by applying, drying and baking the amorphous fluororesin (CTL-809M, available from Asahi Glass Co., Ltd) in the same manner as Example 1. Then, on the etch mask film 15, the photoresist pattern 16 was formed by applying, exposing and developing the photoresist (OFPR-800, available from TOKYO OHKA KOGYO CO., LTD.). Subsequently, the etch mask film 15 was etched according to the photoresist pattern 16 using the dry etcher (EIS-700, available from ELIONIX INC.) to form the etch mask pattern 15' having a desired pattern. The dry etching condition was as follows: antenna power of 300 W; $O_2$ gas flow of 50 sccm; and gas pressure of 2.7 Pa.

Next, the upper electrode film 14 was wet-etched according to the etch mask pattern 15' and the photoresist pattern 16 using a 3 mass % potassium iodide solution to form the upper electrode 14'. Then, the photoresist pattern 16 was removed by acetone cleaning, leaving only the etch mask pattern 15' to remain on the upper electrode 14' to complete the KNN thin film laminated substrate of Example 2.

(Fabrication of KNN Thin Film Laminated Substrate of Example 3)

A KNN thin film laminated substrate of Example 3, which was the same as the KNN thin film laminated substrate of Example 1 except for the configuration of the upper electrode film 14 (or the upper electrode 14', which was a patterned upper electrode film 14), was fabricated.

A 10-nm thick W layer was formed on the KNN thin film 13 (substrate temperature of 100° C.) by electron beam evaporation as the upper electrode adhesive layer to enhance adhesion between the niobate-system ferroelectric thin film 13 and the upper electrode film 14. Subsequently, the upper electrode film 14 was formed by forming a 300-nm thick Au layer on the W adhesive layer (substrate temperature of 100° C.) by electron beam evaporation. The electron beam evaporation was carried out using an electron beam evaporation machine (EX-400-008, available from ULVAC, Inc.).

Next, the KNN thin film laminated substrate of Example 3, having the etch mask pattern 15' on the upper electrode 14', was completed in the same manner as Example 2.

(Fabrication of KNN Thin Film Laminated Substrate of Comparative Example 1)

A KNN thin film laminated substrate of Comparative Example 1, which was the same as the KNN thin film laminated substrate of Example 1 except that it did not have the upper electrode film 14 (in other words, the etch mask film 15 was formed immediately on the niobate-system ferroelectric thin film 13), was fabricated in the same manner as Example 1 except that the upper electrode film 14 was not formed.

More specifically, immediately on the niobate-system ferroelectric film 13, an amorphous fluororesin film having a thickness of 950 nm was formed as the etch mask film 15 by applying, drying and baking the amorphous fluororesin (CTL-809M, available from Asahi Glass Co., Ltd). Then, on the etch mask film 15, the photoresist pattern 16 was formed by applying, exposing and developing the photoresist (OFPR-800, available from TOKYO OHKA KOGYO CO., LTD.). Subsequently, the etch mask film 15 was etched according to the photoresist pattern 16 using the dry etcher (EIS-700, available from ELIONIX INC.) to form the etch mask pattern 15' having a desired pattern. The dry etching condition was as follows: antenna power of 300 W; $O_2$ gas flow of 50 sccm; and gas pressure of 2.7 Pa.

Comparative Example 1 was different from Examples in the sequential order of the upper electrode formation step and the etch mask formation step. In Comparative Example 1, the ferroelectric thin film etching step was followed by the upper electrode formation step. Comparative Example 1 was fabricated for comparison purposes to see how the presence or absence of a noble metal film affects the stability of the etch mask.

(Evaluation of Crystal Structure of Ferroelectric Thin Film)

Perovskite KNN crystals have a tetragonal structure in which, normally, the c-axis is longer than the a-axis (c/a>1). That is, when a tetragonal crystal satisfies the condition c/a>1, the crystal is more stable and its crystallinity is high. When an electric field is applied along the c-axis of a perovskite-type ferroelectric crystal with a small initial strain, a larger polarization (and thus a higher gain in piezoelectric or ferroelectric performance) is obtained.

Meanwhile, unlike bulk crystals, a thin-film crystal formed on a substrate has a crystalline structure that is prone to distortion caused by the influence of the substrate or the underlayer. Specifically, the KNN thin film mainly formed may have a tetragonal crystal system with "c/a>1" (herein referring to "a system closer to a proper tetragonal crystal system") or a pseudo cubic crystal system with "c/a≤1" (herein referring to "a system closer to a cubic crystal system than to a proper tetragonal crystal system"). Therefore, the crystal systems of the KNN thin films formed above were evaluated by X-ray diffraction (XRD). The results showed that Examples 1 to 3 and Comparative Example 1 were each a substrate on which a KNN thin film having a tetragonal crystal system with "c/a>1" was mainly formed.

(Etching Testing)

The KNN thin film laminated substrates of Examples 1 to 3 and Comparative Example 1, each having the etch mask pattern 15', were cut into small test pieces (20 mm×20 mm). The KNN thin films of the test pieces were subjected to wet etching under different etching conditions to form KNN thin film patterns (see FIG. 1(f)).

Various etchants were prepared from chelating agents, an $NH_3$ aq. (made by Kanto Chemical Co., Inc., reagent grade, content of 29%), and an $H_2O_2$ aq. (made by Kanto Chemical Co., Inc., reagent grade, content of 35%).

The chelating agents used were: ethylene diamine tetraacetic acid (EDTA, made by Wako Pure Chemical Industries, Ltd., purity of 99.5% or higher); ethylene diamine tetraacetic acid disodium salt dihydrate (EDTA.2Na, made by DOJINDO LABORATORIES, purity of 99.5% or higher); ethylene diamine tetraacetic acid trisodium salt trihydrate (EDTA.3Na, made by DOJINDO LABORATORIES, purity of 98.0% or higher); ethylene diamine tetraacetic acid tetrasodium salt tetrahydrate (EDTA.4Na, made by DOJINDO LABORATORIES, purity of 98.0% or higher); ethylene diamine tetraacetic acid dipotassium salt dihydrate (EDTA.2K, made by DOJINDO LABORATORIES, purity of 99.0% or higher); ethylene diamine tetraacetic acid tripotassium salt dihydrate (EDTA.3K, made by DOJINDO LABORATORIES, purity of 99.0% or higher); ethtylene diamine tetraacetic acid dilithium salt monohydrate (EDTA.2Li, made by Wako Pure Chemical Industries, Ltd., CAS No. 14531-56-7); ethylene diamine tetraacetic acid diammonium salt (EDTA.2NH$_4$, made by DOJINDO LABORATORIES, purity of 99.0% or higher); ethylene diamine tetra(methylene phosphonic acid) (EDTMP, made by Chelest Corporation, purity of 90% or higher); ethylene diamine tetra(methylene phosphonic acid) pentasodium salt (EDTMP.5Na, made by Italmatch Japan Ltd., Dequest® 2046); nitrilotris(methylene phosphonic acid) (NTMP, made by Tokyo Chemical Industry Co., Ltd., purity of 50% or higher), nitrilotris(methylene phosphonic acid) pentasodium salt (NTMP.5Na, made by Italmatch Japan Ltd., Dequest® 2006), cyclohexane diamine tetraacetic acid monohydrate (CyDTA.H$_2$O, made by Chelest Corporation); 1-hydroxyethane-1,1-diphosphonic acid (etidronic acid) (HEDP, made by Chelest Corporation, purity of 60% or higher); 1-hydroxyethane-1,1-diphosphonic acid (etidronic acid) trisodium salt (HEDP.3Na, made by Italmatch Japan Ltd., Dequest® 2015DN); 1-hydroxyethane-1, 1-diphosphonic acid(etidronic acid) tetrasodium salt (HEDP.4Na, made by Italmatch Japan Ltd., Dequest® 2016); glycine-N,N-bis(methylene phosphonic acid) (GBMP, made by Tokyo Chemical Industry Co., Ltd., purity of 97% or higher); diethylene triamine penta(methylene phosphonic acid) (DTPMP, made by Italmatch Japan Ltd., Dequest® 2060S); diethylene triamine penta(methylene phosphonic acid) heptasodium salt (DTPMP.7Na, made by Italmatch Japan Ltd., Dequest® 2066); citric acid (made by Kanto Chemical Co., Inc., purity of 99% or higher); citric acid monohydrate (made by Kanto Chemical Co., Inc., purity of 99.5% or higher); sodium dihydrogen citrate salt (made by Kanto Chemical Co., Inc., purity of 99% or higher); disodium hydrogen citrate salt hydrate (made by Kanto Chemical Co., Inc., purity of 98% or higher); trisodium citrate salt dihydrate (made by Kanto Chemical Co., Inc., purity of 99% or higher; potassium dihydrogen citrate salt (made by Kanto Chemical Co., Inc., purity of 98% or higher); dipotassium hydrogen citrate salt (made by Kanto Chemical Co., Inc., purity of 98% or higher); tripotassium citrate salt monohydrate (made by Kanto Chemical Co., Inc., purity of 99% or higher); trilithium citrate salt tetrahydrate (made by Kanto Chemical Co., Inc., purity of 98% or higher); ammonium dihydrogen citrate salt (made by Kanto Chemical Co., Inc., purity of 95% or higher); diammonium hydrogen citrate salt (made by Kanto Chemical Co., Inc., purity of 99% or higher); and triammonium citrate salt (made by Kanto Chemical Co., Inc., purity of 98% or higher).

(1) Evaluation of Etching Rate

A relationship between the etching rate and the etching temperature (etchant temperature) was studied. As the etchant, a mixture of 0.1 M of a chelating agent, 3.5 M of an $NH_3$ aq., and 7.5 M of an $H_2O_2$ aq. was used. The initial pH of the etchant was 9.6 to 9.7. The etchant temperature was 60 to 95° C.

In each etching test, the etch mask pattern 15' and the upper electrode 14' were removed after the etching for a predetermined time using the dry etcher (EIS-700, available from ELIONIX INC.). The dry etching condition was as follows: antenna power of 300 W; $O_2$ gas flow of 50 sccm; and gas pressure of 2.7 Pa. Then, the etching performance (herein referring to the average etching rate calculated by dividing the step height of each KNN thin film by the etching time) was evaluated. The results are shown in FIGS. 2 to 3.

Figure 3:
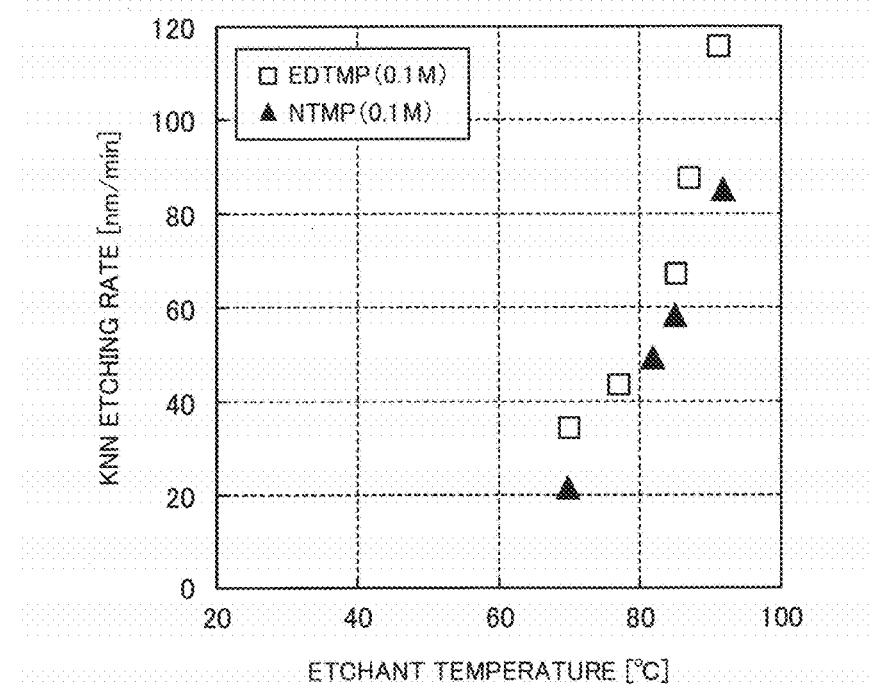
FIG. 3 is a graph showing other exemplary relationships between etching rate and etchant temperature in Example 1.

FIG. 2 is a graph showing exemplary relationships between the etching rate and the etchant temperature in the KNN thin film laminated substrate of Example 1; and FIG. 3 is a graph showing other exemplary relationships between etching rate and etchant temperature in Example 1. As shown in FIGS. 2 and 3, it is observed that with the etchant containing EDTA, the etchant containing EDTA.2Na, the etchant containing EDTMP and the etchant containing NTMP as the chelating agent, the etching rate increases with increasing the etchant temperature (etching temperature).

Table 1 shows relationships between each chelating agent and the etching rate in the KNN thin film laminated substrate of Example 1 when the chelating agent concentration was 0.1 M, and the etchant temperature was 85° C. (85±1° C.). As seen from Table 1, it is observed that a sufficiently high etching rate is achieved with each chelating agent.

TABLE 1

Relationships between Typical Chelating Agents and Etching Rates in KNN Thin Film Laminated Substrate of Example 1 (chelating agent concentration of 0.1 M, and etchant temperature of 85° C.).

| Chelating Agent (0.1 M) | Etchant Temperature | Etching Rate (nm/min) |
|---|---|---|
| EDTA | 85° C. | 45 |
| EDTA • 2Na | | 27 |
| EDTMP | | 67 |
| NTMP | | 58 |
| CyDTA | | 64 |
| HEDP | | 63 |
| GBMP | | 56 |
| DTPMP | | 55 |
| Citric Acid | | 55 |

Also, it was separately observed that in the KNN thin film laminated substrates of Examples 1 and 2, similar results shown in FIGS. 2-3 and Table 1 were obtained with the etchants containing other chelating agents.

Meanwhile, in the KNN thin film laminated substrate of Comparative Example 1, the etching mask pattern 15' peeled off from the niobate-system ferroelectric thin film 13 after approximately 10 minutes with any of the etchants, which made it impossible to perform the etching process while maintaining shape controllability. This reveals that use of an amorphous fluororesin film laminated via a noble metal film (e.g. the upper electrode film 14) as the etch mask is important in the ferroelectric thin film etching according to the present invention.

Herein, the etching rate that is acceptable in terms of mass production efficiency will be briefly discussed. A typical etching rate in a conventional dry-etching process ranges from 10 to 40 nm/min. On the other hand, the etching process according to the present invention is a wet-etching process and is capable of simultaneously etching far more workpieces than a dry-etching process. Assume that it simultaneously etches 10 times as many workpieces as those that can be handled by a single dry-etching machine. Then its throughput in manufacturing is equivalent to that of a dry-etching process with a 10 times higher etching rate. Therefore, even if the etching rate of the etching process according to the invention is equivalent to that of a typical dry-etching process, the invention has a sufficient advantage in terms of mass production efficiency. In other words, an etching rate of 10 nm/min or higher is enough to sufficiently contribute to manufacturing cost reduction.

(2) Influence of Concentration of Chelating Agent

Influences of the concentration of the chelating agent in the etchant on the etching performance were studied. The etching performance on the KNN thin film was evaluated with the concentration of each chelating agent varied in a range from 0.0001 to 1.2 M. The concentration of the $NH_3$ aq. and the concentration of the $H_2O_2$ aq. were the same as those of the above-described etchant (3.5 M and 7.5 M, respectively). The etchant temperature was 85 to 90° C., and the etching time was 30 to 60 minutes. The etchant temperature of 85 to 90° C. and the etching time of 30 to 60 minutes were estimated, based on the results of the etching testing above, to be a temperature and a time required for the KNN thin film 13 having a thickness of approximately 1.9 μm to be sufficiently etched off to expose the lower electrode film 12 (herein, Pt film).

After the 30 to 60-minute etching process, each test piece was taken out and subjected to water washing and drying. Subsequently, the test piece was fractured and the fractured surface was observed with scanning electron microscopy (SEM). The results showed that when the concentration of each chelating agent was 0.1 M, the KNN thin film was sufficiently etched off by the 30 to 60-minute etching process with any of the chelating agents.

In the case where the chelating agent was EDTA, EDTMP, NTMP, HEDP, GBMP, DTPMP, or any one of their salts, and the concentration of the chelating agent was 0.0001 M, even a 60-minute etching process at the temperature of 95° C. failed to sufficiently etch off a KNN thin film having a thickness of 1.9 μm (i.e. the etching rate was insufficient). Meanwhile, a sufficient etching rate was achieved with a chelating agent concentration of 0.001 to 0.5 M. However, the etching rate decreased clearly with a chelating agent concentration of 0.7 M.

On the other hand, when the chelating agent was citric acid or citric acid salt, the etching rate was insufficient with a chelating agent concentration of 0.01 M, while a sufficient etching rate was achieved with a cheating agent concentration of 0.03 to 1 M. However, the etching rate decreased clearly with a chelating agent concentration of 1.2 M.

In addition, cases where a plurality of chelating agents were used in combination were examined. The results showed that a sufficient etching rate (at which a KNN thin film having a thickness of 1.9 μm was completely etched off by a 30 to 60-minute etching process) was achieved with a given combination of the chelating agents used according to the present invention (e.g. "EDTA 0.1 M+EDTA.2Na 0.01 M", "EDTMP 0.01 M+citric acid 0.1 M", "NTMP 0.01 M+citric acid 0.1 M", and "HEDP 0.01 M+citric acid 0.1 M").

From the above investigation results, it is revealed that the chelating concentration in the etchant had little influence on the etching rate.

(3) Influence of Hydrogen Ion Exponent (Potential of Hydrogen)

Influences of the pH of the etchant on the etching performance were studied. The pH adjustment was made by controlling the ammonia concentration, the hydrochloric acid concentration, and the sodium hydroxide concentration. The other components of the etchant were 0.1 M of EDTMP and 7.5 M of an $H_2O_2$ aq. It was observed that the pH had the least influence on the etching rate at 8 to 10 and that the etching rate decreased clearly with a pH less than 7.5 or more than 12.

(4) Influence of Concentration of Hydrogen Peroxide

Influences of the $H_2O_2$ concentration in the etchant on the etching performance were studied. The other components of the etchant was 0.1 M of EDTMP and 3.5 M of an $NH_3$ aq. It was observed that the $H_2O_2$ concentration had the least influence on the etching rate at 4 to 9 M and that the etching rate decreased clearly with an $H_2O_2$ concentration less than 4 M.

(5) Evaluation of Etching Accuracy

Some of the test pieces of the KNN thin film laminated substrates were fine processed by etching off until the lower electrode film 12 was exposed so as to be shaped into a micro pad pattern (200 μm per side, at 200 μm pitch). The microstructure of each test piece was observed with optical microscopy and scanning electron microscopy (SEM).

Figure 4:
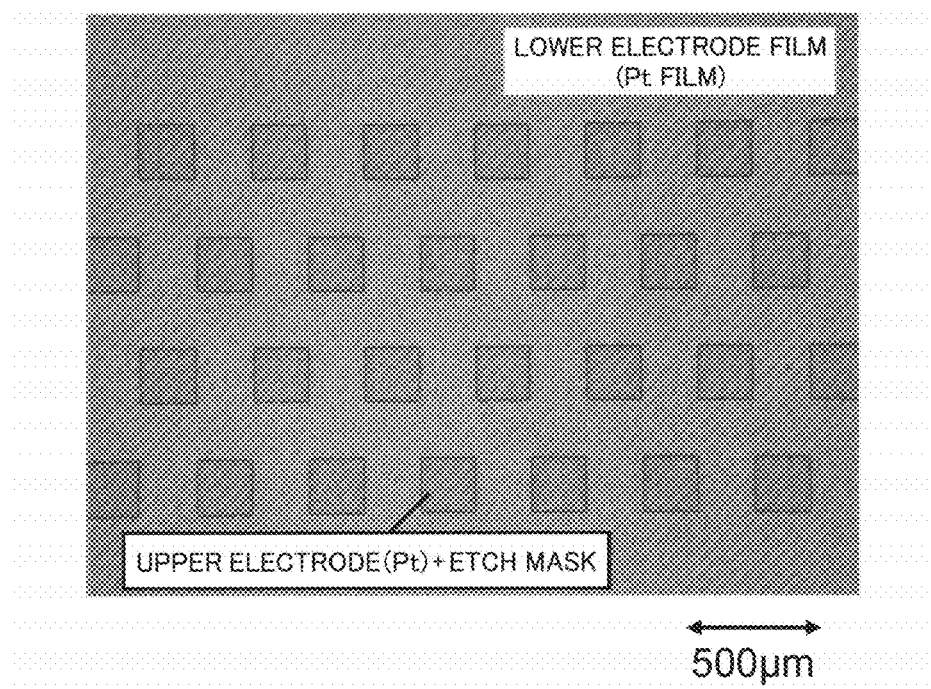
FIG. 4 is an optical microscopy photograph showing an exemplary result of Example 1 of a micro pad patterned KNN thin film laminated substrate.
Figure 5:
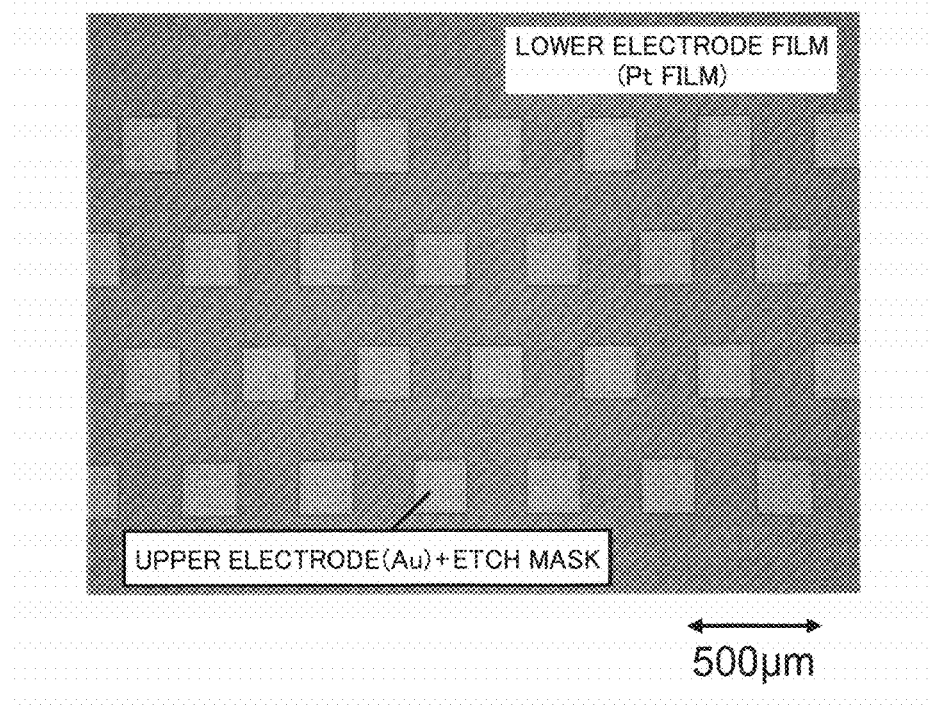
FIG. 5 is another optical microscopy photograph showing an exemplary result of Example 2 of a micro pad patterned KNN thin film laminated substrate.

FIG. 4 is an optical microscopy photograph showing an exemplary result of Example 1 of a micro pad patterned KNN thin film laminated substrate. FIG. 5 is another optical microscopy photograph showing an exemplary result of Example 2 of a micro pad patterned KNN thin film laminated substrate. As shown in FIGS. 4 and 5, it is observed that both KNN thin film laminated substrates were fine patterned exceptionally neatly and accurately. Specifically, no etching and peeling occurred in the Pt film to serve as the lower electrode, which shows that the lower electrode film 12 can serve as an etching stopper. Also, the SEM observation revealed that the amount of the side etching was 20 to 40% of the film thickness.

(3) Fabrication of Piezoelectric Thin Film Device and Evaluation of Ferroelectricity Separately from the test pieces used in the above-described etching rate evaluation testing, test pieces from each of which only the etch mask pattern 15' had been removed using the dry etcher (EIS-700, available from ELIONIX INC.) after the formation of the desired pattern on the KNN thin films were prepared (i.e. each test piece had only the upper electrode 14'). The dry etching condition was as follows: antenna power of 300 W; $O_2$ gas flow of 50 sccm; and gas pressure of 2.7 Pa. Next, the test pieces were subjected to dicing to fabricate chip-shaped KNN thin film devices (KNN thin film devices of Examples 1 to 3).

Also, a reference sample was prepared by dicing a KNN thin film laminated substrate on which the patterning by wet etching according to the present invention had not been performed. Since this reference sample had not been affected by the ferroelectric thin film etching step, it was prepared to serve as the reference for evaluation of ferroelectricity of the formed KNN thin films.

The obtained KNN thin film device chips were measured for the polarization, permittivity, and leakage current density using a ferroelectric characteristics analyzer. FIG. 6 is a graph showing exemplary relationships between the polarization value and the applied voltage of the KNN thin film device fabricated according to the present invention and the reference sample. The KNN thin film device in FIG. 6 was a device of Example 1 fine processed with an etchant for which EDTMP was used. As shown in FIG. 6, the polarization hysteresis loop of the KNN thin film device fabricated according to the invention (Example 1) almost completely matches that of the reference sample, which means there is no substantial difference in polarization between the two samples.

Difference in the permittivity between the KNN thin film device fabricated according to the invention and the reference sample was as small as about 1%. This degree of difference is within a range of sample to sample variation and measurement error. Thus, there is practically no difference between the two samples. The leakage current difference, too, was within the range of sample to sample variation and measurement error. Again, there is practically no difference between the two samples.

These ferroelectric characteristics measurements demonstrate that ferroelectric thin films can be fine patterned by the invention's etching process without deteriorating their ferroelectric characteristics.

Examination 2

[Lithium Niobate Thin Film Device]

(Preparation of LN Substrate)

To simplify the testing processes, a single crystalline substrate (10 mm×10 mm×0.5 mm) of lithium niobate ($LiNbO_3$: LN) was prepared. As with the KNN thin film laminated substrates described above, an etch mask film 15 and a photoresist pattern 16 were formed via an upper electrode film 14 on one surface of the LN single crystalline substrate. Subsequently, an etch mask pattern 15' and an upper electrode 14' were formed using the dry etcher (EIS-700, available from ELIONIX INC.). Then, the photoresist pattern 16 was removed by acetone cleaning to obtain an LN substrate having the upper electrode 14' and the etch mask pattern 15' on one side.

After the other side of the LN substrate (the side on which the upper electrode 14' and the etch mask pattern 15' were not formed) was masked, etching testing and etching performance evaluation were conducted in the same manner as the KNN thin film devices. The results showed that the etching performance achieved was comparable to those of the KNN thin film devices.

Examination 3

[Investigation of Etchant Preparation Method]

With an aim to improve work efficiency in the ferroelectric thin film etching step, the etchant preparation method was investigated. As the ferroelectric thin film to be subjected to etching, a KNN thin film laminated substrate of Example 1 was used as is the case with Examination 1.

(Etching Testing)

Two etchants were prepared, each from 0.4 M of citric acid, 3.5 M of an $NH_3$ aq., and 7.5 M of an $H_2O_2$ aq. by two different methods (the volume was 2 L each). One was prepared by a three-reagent mixing system in which the three reagents were mixed in a single step (hereinafter referred to as Etchant A). The other was prepared by a two-reagent mixing system in which a separately prepared citric acid/ammonia concentrated solution (citric acid of 1.43 M/ammonia of 12.5 M) was added to the $H_2O_2$ aq. (hereinafter referred to as Etchant B).

The time required to mix the reagents was measured for each etchant. For Etchant A, the time from the start of mixing and stirring of the three reagents to completion of melting of the citric acid (visually judged) was approximately 30 minutes. For Etchant B, the time from the start of mixing and stirring of the two reagents to completion of homogenous mixing (visually judged) was approximately 30 seconds.

In the same manner as Examination 1, the KNN thin film was subjected to wet etching using each of Etchant A and Etchant B. The results showed that there was no difference between Etchant A and Etchant B, indicating that they were equal in etching performance. In other words, since there is no difference in etching performance, use of an etchant prepared by the two-reagent mixing system can reduce the time required for the entire etching step (resulting in improving the work efficiency).

Next, another investigation was carried out to verify the preservability of the etchant and the chelating agent/ammonia concentrated solution. An etchant prepared by the two-reagent mixing system and preserved for a week (hereinafter referred to as Etchant B') and another etchant freshly prepared from a citric acid/ammonia concentrated solution that had been preserved for a week (hereinafter referred to as Etchant B") were individually subjected to etching testing.

It was observed that Etchant B' failed to etch the KNN thin film, while Etchant B" exhibited an etching performance that is equivalent to those of Etchant A and Etchant B. Based on this examination 3, it was concluded that the etchant itself should be preferably prepared immediately before the wet-etching process, while the chelating agent/ammonium concentrated solution is excellent in preservability.

The above embodiments and examples of the invention as well as the appended claims and figures show multiple characterizing features of the invention in specific combinations. The skilled person will easily be able to consider further combinations or sub-combinations of these features in order to adapt the invention as defined in the claims to his specific needs.

LEGEND

10 . . . ferroelectric thin film laminated substrate;
11 . . . substrate;
11' . . . diced substrate of chip;
12 . . . lower electrode film;
12' . . . lower electrode;
13 . . . ferroelectric thin film;
13' . . . patterned ferroelectric thin film;
14 . . . upper electrode film;
14' . . . upper electrode;
15 . . . etch mask film;
15' . . . etch mask pattern;
16 . . . photoresist pattern; and
20 . . . ferroelectric thin film device.

The invention claimed is:

1. A method for manufacturing a niobate-system ferroelectric thin-film device comprising:
a lower electrode film formation step of forming a lower electrode film on a substrate;
a ferroelectric thin film formation step of forming a niobate-system ferroelectric thin film on the lower electrode film;
an etch mask pattern formation step of forming an etch mask in a desired pattern on the niobate-system ferroelectric thin film, the etch mask being an amorphous fluororesin film laminated via a noble metal film; and
a ferroelectric thin film etching step of shaping the niobate-system ferroelectric thin film into a desired fine pattern by wet etching using an etchant comprising:
a chelating agent;
an aqueous alkaline solution containing an aqueous ammonia solution; and
an aqueous hydrogen peroxide solution.

2. The method for manufacturing a niobate-system ferroelectric thin-film device according to claim 1, the method further comprising:
an upper electrode formation step of forming an upper electrode on the niobate-system ferroelectric thin film, the upper electrode being the noble metal film; and
a dicing step of cutting a chip-shaped niobate-system ferroelectric thin film device out from the substrate, having thereon the niobate-system ferroelectric thin film, having thereon the upper electrode.

3. The method for manufacturing a niobate-system ferroelectric thin-film device according to claim 1, wherein the chelating agent is at least one selected from ethylene diamine tetraacetic acid, ethylene diamine tetra(methylene phosphonic acid), nitrilotris(methylene phosphonic acid), cyclohexane diamine tetraacetic acid, 1hydroxyethane-1,1-diphosphonic acid(etidronic acid), glycine-N,N-bis(methylene phosphonic acid), diethylene triamine penta(methylene phosphonic acid), citric acid, and their salts.

4. The method for manufacturing a niobate-system ferroelectric thin-film device according to claim 3,
wherein when the chelating agent is ethylene diamine tetraacetic acid, ethylene diamine tetra(methylene phosphonic acid), nitrilotris(methylene phosphonic acid), cyclohexane diamine tetraacetic acid, 1-hydroxyethane-1,1-diphosphonic acid(etidronic acid), glycine-N,N-bis(methylene phosphonic acid), diethylene triamine penta(methylene phosphonic acid), or any one of their salts, the chelating agent in the etchant has a molarity of 0.001 M or more and 0.5 M or less, and
wherein when the chelating agent is citric acid or citrates, the chelating agent in the etchant has a molarity of 0.03 M or more and 1 M or less.

5. The method for manufacturing a niobate-system ferroelectric thin-film device according to claim 3, wherein the salts for the chelating agent is at least one selected from sodium salt, potassium salt, lithium salt, and ammonium salt.

6. The method for manufacturing a niobate-system ferroelectric thin-film device according to claim 1, wherein the noble metal film is a platinum film via a titanium layer or a gold film via one of a nickel layer, a cobalt layer, a tungsten layer and a molybdenum layer.

7. The method for manufacturing a niobate-system ferroelectric thin-film device according to claim 1, wherein at the ferroelectric thin film etching step, the etchant has a temperature of 60° C. or higher and lower than 100° C.

8. The method for manufacturing a niobate-system ferroelectric thin-film device according to claim 1, wherein the niobate-system ferroelectric thin film is made of potassium sodium niobate or lithium niobate.

9. The method for manufacturing a niobate-system ferroelectric thin-film device according to claim 1, wherein the lower electrode film is a platinum film via a titanium layer.

10. The method for manufacturing a niobate-system ferroelectric thin-film device according to claim 1, wherein the niobate-system ferroelectric thin film has a pseudo cubic system or a tetragonal system, and is formed by sputtering such that the film has a main surface with a (001) crystal plane preferential orientation.

11. The method for manufacturing a niobate-system ferroelectric thin-film device according to claim 1, wherein the substrate is a silicon substrate having a thermally oxidized film on its surface.

* * * * *